United States Patent [19]
Koblitz et al.

[11] Patent Number: 5,524,289
[45] Date of Patent: Jun. 4, 1996

[54] METHOD AND CIRCUIT FOR AN AUTOMATIC, HIGH PRECISION FREQUENCY FINE TUNING

[76] Inventors: Rudolf Koblitz, 24, chemin de Bérivière, F-38240 Meylan, France; Martin Rieger, Zepfenhaner Str. 1, D-78628 Rottweil; Sabine Roth, Auf der Wanne 67, D-78048 Villingen-Schwenningen, both of Germany

[21] Appl. No.: 90,184

[22] PCT Filed: Jan. 18, 1992

[86] PCT No.: PCT/EP92/00091

§ 371 Date: Mar. 14, 1994

§ 102(e) Date: Mar. 14, 1994

[87] PCT Pub. No.: WO92/13389

PCT Pub. Date: Aug. 6, 1992

[30] Foreign Application Priority Data

Jan. 29, 1991 [DE] Germany .......................... 41 02 562.8

[51] Int. Cl.[6] .................................................. H04B 1/16
[52] U.S. Cl. ...................... 455/182.3; 455/160.1; 455/192.3; 455/234.1; 348/735
[58] Field of Search .............................. 455/182.3, 182.2, 455/192.2, 192.3, 160.1, 192.1, 182.1, 234.1, 235.1; 348/735, 732

[56] References Cited

U.S. PATENT DOCUMENTS

| 4,245,351 | 1/1981 | Tults | 455/182 |
| 4,358,791 | 11/1982 | French | 455/192.3 |
| 4,977,613 | 12/1990 | Holcomb, Sr. et al. | 455/192.3 |

FOREIGN PATENT DOCUMENTS 2852839  6/1980  Germany ........................ H03J 3/10

*Primary Examiner*—Reinhard J. Eisenzopf
*Assistant Examiner*—Doris To
*Attorney, Agent, or Firm*—Joseph S. Tripoli; Peter M. Emanuel; Frederick A. Wein

[57] ABSTRACT

For the purpose of a high precision frequency fine tuning, for example, to a certain television channel, an analog circuit, the frequency of which can be balanced, for example, an demodulator, is balanced in an integrated circuit with the help of a control current. The control current generated in a regulating loop is dependent on a reference frequency with the appropriate accuracy and on a reference frequency with the appropriate accuracy and on a reference capacitance integrated on the chip. After selecting a frequency, the analog circuit is calibrated and the frequency is subsequently fine-tuned in a measuring mode. Following that, the analog circuit operates in the normal mode.

10 Claims, 2 Drawing Sheets

METHOD AND CIRCUIT FOR AN AUTOMATIC, HIGH PRECISION FREQUENCY FINE TUNING

The invention concerns a method and a circuit for an automatic, high precision frequency fine tuning with the help of an analog circuit, in which the frequency can be balanced, in an integrated circuit.

BACKGROUND

In the field of electronic signal processing, it is frequently necessary to accurately balance (align) frequencies or frequency-dependent circuits, for example, when adjusting tuners or balancing frequency generators.

Corresponding AFT (automatic fine tune) techniques are known from, for example, "Television Engineering Handbook", page 13.117, K. Blair Benson, McGraw-Hill Book Company. In this the phase shift in a parallel resonant circuit is evaluated.

FIG. 1 shows an appropriate block circuit diagram. An output signal 10 influenced by a tuning, for example, a television audio signal, is fed to a resonant circuit 11 and a first input of a phase detector 12. The resonant circuit is tuned to a desired frequency. The output signal from the resonant circuit 11 is fed to a second input of the phase detector. The output signal from the phase detector is filtered in a low-pass 13 and serves as regulating variable 14 for the tuning of the input signal 10. A circuit suitable for this is, for example, an FM demodulator 15 which can be tuned by a regulating variable and to which the regulating variable 14 and a signal 16 for demodulating are fed.

In this particular application, however, only a tuning accuracy of about 150 kHz can be achieved with the state of the art. Apart from that, such known AFT circuits cannot be fully integrated. For example, two connections to an integrated circuit are required for an external resonant circuit.

A further known solution consists of counting digitally the frequency to be tuned and to re-adjusting it accordingly. However, the expenditure on circuitry and the corresponding chip area in an integrated circuit required herefor are high. The current consumption for such a digital AFT circuit is also relatively high.

SUMMARY OF THE INVENTION

It is the object of the invention to specify a method for automatic, high precision frequency fine tuning with little expenditure on circuitry and current consumption in integrated circuits.

In principle, the method according to the invention is that, for the purpose of automatic, high precision frequency fine tuning, for example, of a certain television channel, for an analog circuit, in which the frequency can be balanced, within an integrated circuit, at least one regulating variable for the frequency-balanceable analog circuit is formed and stored depending on a high precision reference frequency, the value of said variable is also influenced by a reference circuit section within the integrated circuit, and that for the fine tuning, successively, different operating modes are switched on.

It is a further object of the invention to specify a circuit for the method according to the invention.

In principle, the circuit according to the invention is provided with an analog circuit 23, 33, in which the frequency can be balanced by means of a regulating variable, with a feeding point for a high precision reference frequency $f_{ch}$, a first, second and third change-over switch, a first T1, second T2 and third T3 automatic gain control amplifier, a first CL and a second CH comparator, a summer (adder) 21, and with an internal capacitor $C_{int}$, whereby:

an output voltage V1 from the analog circuit 23 is fed to the second inputs of the first T1 and the second T2 automatic gain control amplifiers and the first CL and the second CH comparators;

a reference voltage $V_{ref}$ is fed to a first input 251 of the first automatic gain control amplifier T1 in a normal mode;

a combined voltage, consisting of the reference voltage $V_{ref}$ and a compensation voltage $V_{op}$, is fed to a first input 252 of the second automatic gain control amplifier T2 in calibration mode;

a difference voltage, being the difference between the reference voltage $V_{ref}$ and a threshold voltage $V_{th}$, is fed to a first input 254 of the first comparator CL and a summation voltage, being the sum of the reference voltage $V_{ref}$ and the threshold voltage $V_{th}$, is fed to a first input 253 of the second comparator CH in a measuring mode;

an output signal from the first automatic gain control amplifier T1 is fed to a first input N of the third change-over switch in the normal mode;

an output signal from the second automatic gain control amplifier T2 is fed to a third input C of the third change-over switch in the calibration mode;

an output signal from the third change-over switch is fed to an input of the third T3 automatic gain control amplifier;

an output signal from the third T3 automatic gain control amplifier is fed to a first input of the summer 21;

a signal, derived from the size of the internal capacitor $C_{int}$ and modified by the factor k, is fed to a second input of the summer 21;

an output signal from the summer 21 is fed to a control input of the analog circuit 23;

a wanted signal which is to be processed in the analog circuit 23 is fed to a first input N of the first change-over switch in the normal mode;

a supplementary (auxilliary) signal frequency is fed to a second input C, M of the first change-over switch in the calibration and in the measuring mode;

the high precision reference frequency $f_{ch}$ or a frequency derived from it is fed to a first input C of the second change-over switch in the calibration mode;

a signal frequency derived from the output signal of the first change-over switch is fed to a second input N, M of the second change-over switch;

an output signal from the second change-over switch is fed to the analog circuit 23.

The output signals from the first and the second comparator can then, for example, be used to tune an oscillator in a television apparatus tuner.

The method is suitable for integrated circuits and enables an automatic frequency fine tuning by employing analog circuits, in which the frequency can be balanced, for example, FM demodulators or frequency generators. The AFT circuit according to the invention contains a regulation loop which works automatically with a regulating variable generated therein. This regulating variable is additionally influenced by a reference component, for example, a reference capacitance, on the chip carrier of the integrated circuit, whereby within a respective value of this reference component, production tolerances due no the manufacture of the integrated circuit are expressed. As a reference, the AFT circuit in calibration mode is fed with a reference frequency which possesses the necessary accuracy. With this, three operating modes are provided in order to be able to perform the AFT function:

a) normal mode, b) calibration mode, c) measuring mode.

In the calibration mode, the analog circuit firstly is frequency balanced. This balancing is then maintained until the calibration mode is switched on again. Subsequently, in the measuring mode, a current value of a frequency which is to be fine-tuned is determined with the help of the previously balanced analog circuit. An appropriate fine tuning then takes place according to whether this determined value is less than, equal to or greater than a desired value for the frequency which is to be fine-tuned. Following this, the normal mode is switched on, in which the analog circuit is used for its actual task.

Advantageously, the balancing and the fine tuning are controlled (driven) by the current through employing a storage capacitor and by transconductance amplifiers.

BRIEF DESCRIPTION OF THE DRAWINGS

Embodiment examples of the invention are described by means of the drawings. The drawings show in.

DETAILED DESCRIPTION OF THE PREFERRED EMBODIMENT

In the following, three operating modes of the AFT circuit for balancing an FM demodulator and for generating signals for fine tuning are first described. If, for example, a television apparatus is switched on or the reception channel in this television apparatus is changed, then firstly, the calibration mode is selected for a short time (this selection and the choice of the other operating modes advantageously happens automatically). Hereby, the FM demodulator is finely balanced by a regulating variable with the help of a precise reference frequency, for example the color subcarrier frequency, and a value for this regulating variable is stored.

Following this, the measuring mode is selected for a short time. By means of the output voltage of the previously balanced FM demodulator, two comparators detect whether the IF frequency and, therewith, the frequency of the tuner oscillator need to be maintained, reduced or increased.

After the tuner oscillator has been balanced, the normal mode is switched on.

1. Normal Mode

Figure 2:
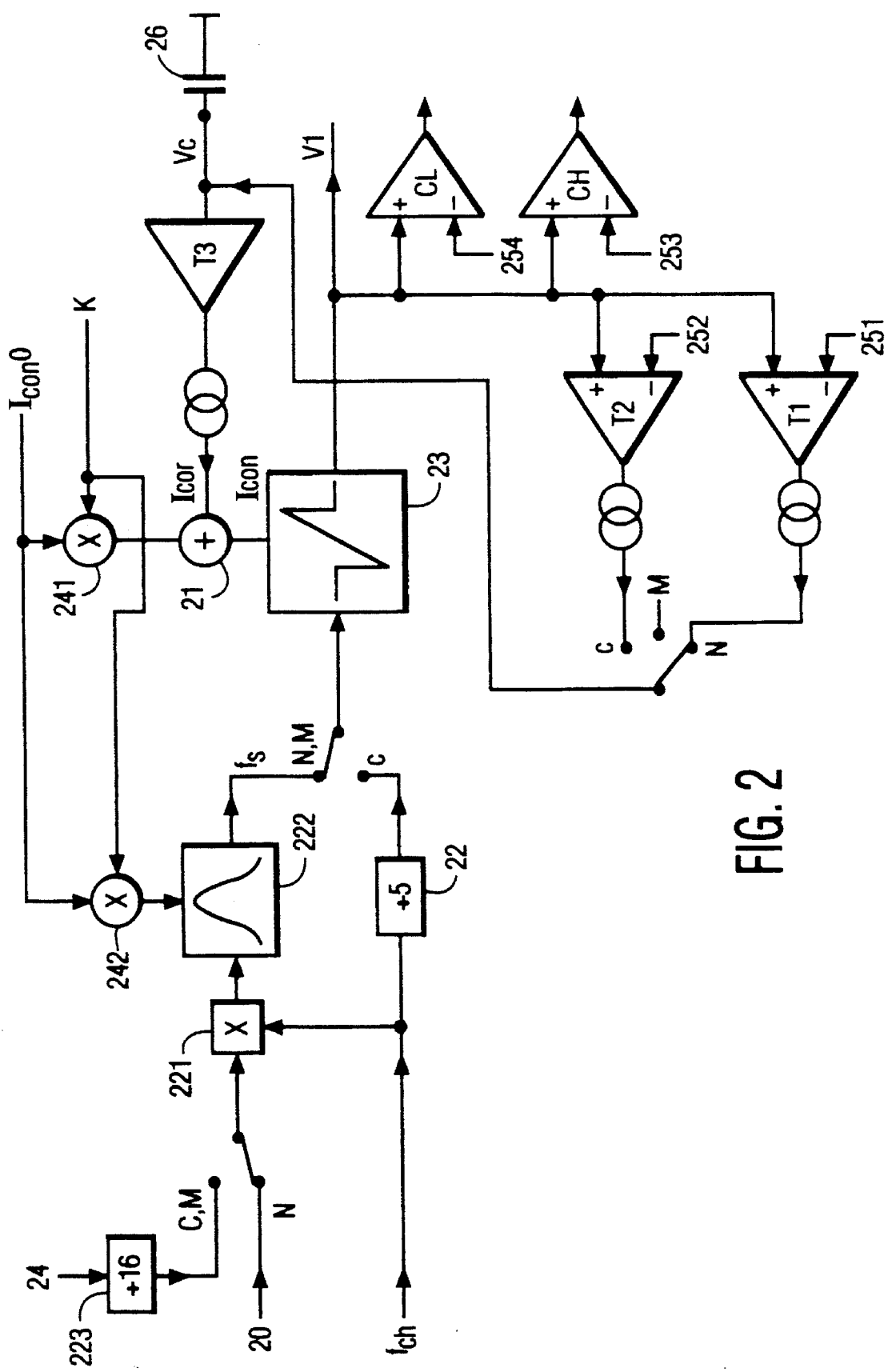
FIG. 2 an AFT circuit according to the invention.

In FIG. 2 the switch position "N" corresponds to this operating mode. The entire circuit functions as an FM demodulator with automatic balancing of the mid-range frequency. The IF output audio signal 20 of a 4.5 MHz band-pass filter serves, for example, as signal source. This output signal is shifted (converted) to 920 kHz in a mixer 221, which also receives the frequency $f_{ch}$=3.579545 MHz of a color subcarrier oscillator, band-pass filtered in a filter 222 with the quality Q=3, and then forms the input signal $f_s$ which is demodulated in an FM demodulator 23.

The FM demodulator Z3 contains an internal, current-controlled oscillator (not shown) with a free running state frequency $$f1=k_d*I_{con}/C_{int}, \qquad (1)$$

where $k_d$ is a first constant, $I_{con}$ the control current for the FM demodulator 23 and $$C_{int}=C_{nom}\pm\text{delta}C \qquad (2)$$

is an internal capacitor integrated on the circuit (not illustrated) with a nominal value of Cnom and an absolute production tolerance of ±deltaC.

The free running state frequency of the oscillator and, therewith, the tuning of the FM demodulator can be synchronized to the frequency of the input signal $f_s$ in case $$|f_s-f1| \text{ less or deltaf}_1, \qquad (3)$$

where $\text{deltaf}_1$=synchronizing range.

If the input signal $f_s$ is frequency-modulated, then $$f_s=fc+\text{deltaf}_s(t) \text{ is valid}, \qquad (4)$$

where fc the is the mid-range frequency and $\text{deltaf}_s$ is the swing. For the frequency $f_1$ of the synchronized oscillator, $f_1=f_s$ is valid as long as $\text{deltaf}_s$ less or $\text{deltaf}_1$. Then the low-pass filtered output voltage $V_1$ represents the demodulated audio signal $$V_1=-k_f*(f_1-f_c)+V_{ref}, \qquad (5)$$

where $k_f$ is the gradient of the demodulator characteristic curve and $V_{ref}$ is a reference voltage.

To permit a better understanding, no IF output audio signal 20 shall be applied in the AFT circuit in FIG. 2 to start with. A first transconductance amplifier $T_1$, a storage capacitor $C_{stor}$, a third transconductance amplifier $T_3$ and the FM demodulator 23 form a balancing loop. The reference voltage $V_{ref}$ is fed to the input 251 of the first transconductance amplifier. If, between the mid-range frequency $f_c$ and the free running state frequency $f_1$, a frequency difference in the range $$0 \text{ less or } |f_1-f_c| \text{ less or deltaf}_1 \qquad (6)$$

appears, then the automatic balancing loop corrects the free running state frequency $f_1$ to $f_1=f_c$ in the following manner: If the output voltage $V_1$ alters according to equation (5), then, using a maximum output current of, for example, ±0.5 microA, the first transconductance amplifier T1 (this has a transconductance $k_1$) charges an external storage capacitor 26 ($C_{stor}$) to a storage voltage $$V_c=(V_1-V_{ref})*k_1/(p*C_{stor}), \qquad (7)$$

where p is the complex frequency. According to the storage voltage $V_c$, the third transconductance amplifier $T_3$ (this has a transconductance $k_3$) generates a correction current $$I_{cor}=k_3*V_c \qquad (8)$$

which is added in an summer 21 to, for example, a control current $I_{con0}$ which takes account of the production tolerances, and then forms the demodulator control current $$I_{con}=k*I_{con0}+I_{cor} \qquad (9).$$

The control current $I_{con0}$ can also serve for balancing the filter 222. A first 241 and a second 242 multiplier hereby multiply the control current $I_{con0}$ in the normal mode by a factor k=1.

From the equations (1), (2), (5) and (7) through (9), one can obtain, by appropriate translation, the corrected free running state frequency $$f_{1c}=k_d/(C_{nom}\pm deltaC)*(I_{con0}-k_3*k_1*k_f*(f_1-f_c)/(p*C_{stor})) \quad (10)$$

Typical values are $k_d$=1, $f_s$=920 kHz, $C_{int}=C_{nom}$=10 pF, $I_{con}=I_{con0}$, $f_1=f_s$, $V_1=V_{ref}$, $C_{stor}$=1nF.

The limit frequency in the balancing loop lies at 20 Hz in order to avoid audio signals creating distortions in the correction current $I_{cor}$.

The correction current $I_{cor}$ can be advantageously exploited also for tuning the filter 222, for example, by employing a second summer of by feeding the demodulator control current $I_{con}$ directly to this filter (not shown).

The signal-to-noise ratio of the FM demodulator 23 is roughly inversely proportional to the synchronizing range deltaf1. For that reason, $deltaf_1$ should be made as small as possible.

In case the automatic balancing loop is not used and $I_{cor0}$ is— instead of the correction current $I_{cor}$—a constant current dependent on the absolute value of the internal capacitor $C_{int}$, then it can be seen from equations (1) and (2) that the free running state frequency f1 depends on the absolute tolerance deltaC. This tolerance has a value of about ±15%.

Given these conditions and in order to guarantee a still good synchronization, $deltaf_1$ should not fall below a minimum value of $$deltaf1=deltaf_s+(deltaC/C_{nom})*fc. \quad (11)$$

An advantageous value for $deltaf_1$ can be obtained by using the following numerical values:

$$deltaf_1=70 \text{ kHz}+0.15*920 \text{ kHz}=208 \text{ kHz}.$$

Now, let is be assumed that the demodulator control current $I_{con}$ is proportional to the internal capacitor $C_{int}$. Thereby, the second term on the right-hand side of equation (11) changes and the synchronizing range $deltaf_1$ becomes $$deltaf1 \text{ larger or } deltaf_s+df_1*f_c, \quad (11a)$$

where $df_1$ represents a frequency offset which is caused by the differing behaviour between the FM demodulator 23 and the components generating the demodulator control current $I_{con}$ in relation to thermal drift and parasitic effects. The maximum value of df1 is about 5%. The aforementioned numerical values then alter to give $$deltaf_1=70 \text{ kHz}+0.05*920 \text{ kHz}=116 \text{ kHz}.$$

If now the automatic balancing loop is also in operation, df1 loses its significance and becomes zero in equation (11a) and the numerical value for deltaf1 changes to $deltaf_1$=70 kHz.

2. Calibration Mode

The AFT circuit can be calibrated. In FIG. 2 the switch position "C" corresponds to this operating mode. For this, an accurate, known frequency is used. For example, the crystal-stablized frequency $f_{ch}$=3.579545 MHz of a color oscillator is reduced to a fifth in a first divider 22. This results in the calibrating frequency $f_{cal}$=715.909 kHz. The demodulator control current $i_{con}$ is, for example, reduced in the first 241 and the second 242 multiplier by a factor k=0.78. Therewith, the calibrated free running state frequency becomes $$f_{1cal}=0.78*f1=717 \text{ kHz}. \quad (12)$$

Based on the frequency offset $$deltaF=f_{mea}-f_{cal} \quad (13)$$

between the calibration frequency $f_{cal}$ (715.909 kHz) and an AFT measuring frequency $f_{mea}$, a compensation voltage $V_{ref}-V_{of}$ is fed to an input 252 of a second transconductance amplifier T2. In accordance with equation (5), $V_{of}$ results as $$V_{of}=deltaF*k_f. \quad (14)$$

The second transconductance amplifier T2 supplies a maximum output current of, for example, ±300 microA with a transconductance $k_2$ and charges the storage capacitor 26 ($C_{stor}$) so that the following is valid for the corrected, calibrated free running state frequency:

$$f'_{1cal}=f_{1cal}+V_{of}*k_f. \quad (15)$$

Similar to equation (10) the following is then valid:

$$f'_{1cal}=k_d/(C_{nom}\pm deltaC)*(I_{con0}-k_3*k_2*(f_{1cal}-f_{cal})-V_{of})/(p*C_{stor})) \quad (16)$$

The theoretical frequency faulty balance based on the differing behaviour between FM demodulator 23 and the components generating the demodulator control current $I_{con}$ then results as $$f1cal+deltaF-f_{cal}=df_{1cal}*f_{cal} \quad (17)$$

=0.05*717 kHz=35.9 kHz and is advantageously eliminated, as in the normal mode, by the automatic tuning. An intermediate frequency $f_{IF}$=45.75 Mhz is fed to an intermediate frequency input 24 and said frequency is reduced in a subsequent second divider 223 by, for example, a factor n=16. This reduced frequency is mixed with the color oscillator frequency $f_{ch}$ in the mixer 221 which applies a measuring frequency $$f_{mea}=f_{IF}/16-f_{ch} \quad (18)$$

to the input of the FM demodulator 23. If, for example, $f_{mea}$=45.75 MHz/16-3.579545 MHz=720.17 kHz and kf=20 mV/kHz, then deltaF=4.261 kHz and $V_{of}$=85 mV.

The limit frequency of the balancing loop is a factor of $k_2/k_1$=300 microA/0.5 microA=600 times higher than in the normal mode and comes to about 10 kHz. This permits an advantageously short calibration time of $t_{cal}$ less than $10/f_{1cal}$ which corresponds to approximately 1 ms.

3. Measuring Mode

Before the AFT circuit can operate in the measuring mode, it must be calibrated as described under 2.) above.

In FIG. 2 the switch position "M" corresponds to the operating mode "measuring mode". The signal source in the measuring mode is either an intermediate frequency VCO (voltage-controlled oscillator) or an amplified and limited intermediate frequency signal at the intermediate frequency input 24. The frequency $f_{IF}$ of this intermediate frequency signal is reduced in the second divider 223 Dy the dividing factor n, for example, n =16, and mixed with the color oscillator frequency $f_{ch}$ in the mixer 221 which applies a measuring frequency $f_{mea}=f_{IF}/16-f_{ch}$ to the input of the FM demodulator 23, as in the calibration mode.

When $f_{IF}$=45.75 MHz, n=16 and $f_{ch}$=3.579545 MHz, $f_{mea}$=720.17 kHz again.

The control current $I_{con0}$ and, therewith, the free running state frequency $f_{1mea}$ of the internal oscillator of the FM demodulator 23 is multiplied, as in the calibration mode, with k=0.78.

As the automatic balancing loop is open in the measuring mode, the storage voltage $V_c$ remains constant and $f_{1mea}$ equals $f_{1cal}$, for example, as in equation (16). The compensation voltage $V_{of}$ mentioned in section 2.) has been selected so that in the measuring mode, the nominal measuring frequency $f_{meanom}$ from the signal derived from the intermediate frequency $f_{IF}$ is equal to $f_{1cal}$. The output voltage $V_1$ is additionally fed to a first comparator CL and a second comparator CH. The first comparator also receives the voltage $V_{ref}-V_{th}$ at its input 254 and the second comparator receives the voltage $V_{ref}+V_{th}$ at its input 253, whereby $V_{th}$ is a threshold voltage. The two comparators CL and CH with the threshold voltage $V_{th}$, detect whether $f_{mea}$ has the correct value ($f_{mea}$ approximately corresponds to $f_{meanom}$) or is too high or too low.

If, as in the calibration mode, the gradient of the demodulator characteristic curve $k_f=20$ mV/kHz, then $V_{th}=k_f*1$ kHz=20 mV is advantageously selected as threshold voltage.

This effects a jump in level of the output signals of the comparators if $|f_{meenom}-fmeal|$ larger or 1 kHz.

The faulty tuning of the intermediate frequency resulting from this is deltaf$_{IF}$=n*$V_{th}$/kf which, in the example above, gives deltaf$_{IF}$=16 kHz.

If the FM demodulator 23 is designed for a synchronizing range with the value deltef1, then the AFT circuit can re-adjust an intermediate frequency faulty tuning up to n*deltaf$_1$.

For example, for n=16, deltaf$_1$=100 kHz is an advantageous value.

Advantageously, in FIG. 2 the reference voltage $V_{ref}$ has a value of half that of the operating voltage $V_{cc}$ for the integrated circuit.

Instead of the frequency $f_{ch}$ fed to the mixer 221 and the first divider 22, frequencies from another crystal-stabilized source can also be used, being fed to the mixer and replacing the output signal of the first divider.

For other input frequencies at the inputs 20 and 24 there results correspondingly modified frequencies at the output of the filter 222 and the first divider 22, an appropriately modified value for the factor k and a modified dividing factor for the first divider 22. For example, for a television standard with CCIR standard B/G, the following values result:

frequency at input 223 of mixer 221: 5.875 MHz $f_{IF}$=38.9 MHz $f_{meanom}$=38.9 MHz/16-2.9375 MHz=506 kHz fcal=500 kHz deltaF=6 kHz $V_{of}$=6 kHz*$k_f$=120 mV k in normal mode: 1.00 k otherwise: 1.01

Figure 1:
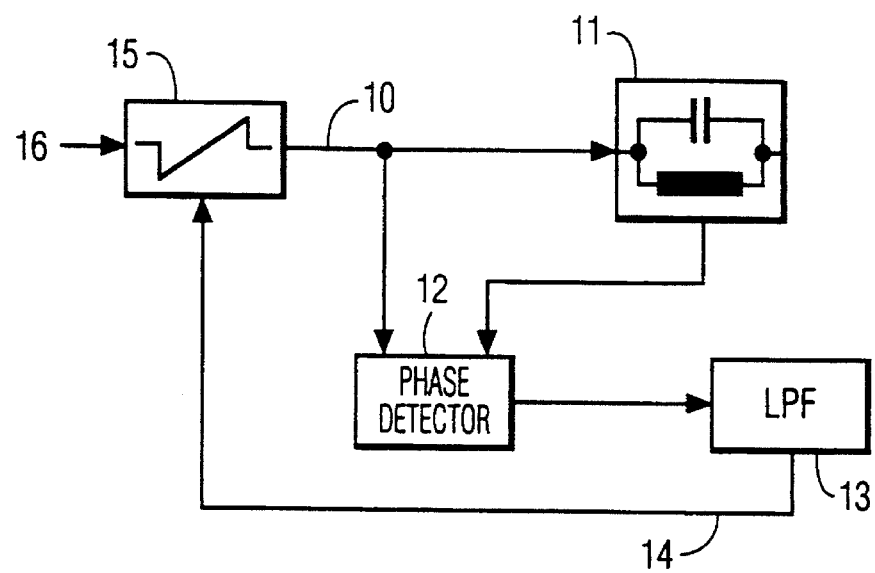
FIG. 1 a known AFT circuit.
Figure 3:
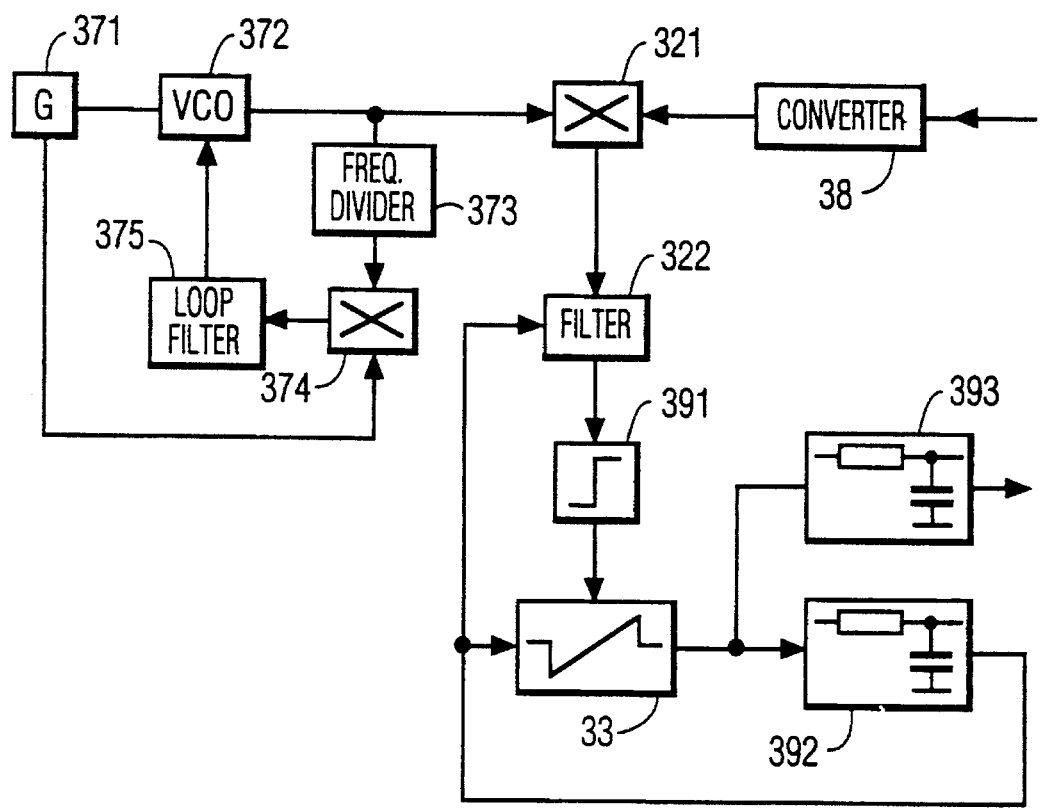
FIG. 3 the application of the AFT circuit according to the invention in an extended integrated circuit for television devices.

In FIG. 3 a section from an integrated circuit is reproduced in which an audio demodulation with the help of the AFT circuit according to the invention is illustrated (only normal mode).

A converter 38 receives an IF signal at its input and feeds the filtered output signal, for example, a 4.5/5.5/6.0 MHz audio IF signal, to a first input of a first mixer 321. This mixer may correspond to the mixer 221 in FIG. 2. At its second input the first mixer 321 receives the output signal from a VCO circuit 372 which supplies a suitable mixing frequency. This output signal is transmitted via a frequency divider 373 to a first input of a second mixer 374 which receives a signal from a reference oscillator 371 at its second input. The output signal from the second mixer 374 is fed via a loop filter 375 to the VCO circuit 372 whereupon a regulating loop is closed. This regulating loop performs the function of the automatic balancing loop described in FIG. 2. The output signal from the first mixer 321 is sent to a filter 322, the function of which corresponds to the filter 222 in FIG. 2. The filtered signal is then fed via a limiter 391 to an FM demodulator 33. This FM demodulator corresponds to the FM demodulator 23 in FIG. 2. The bands of the output signals of the FM demodulator 33 are subsequently limited in a first low-pass filter 393 and in a second low-pass filter 392. An audio signal can be picked up at the output of the first low-pass filter and a regulating voltage, which is fed to the FM demodulator 33 and the filter 322 for fine tuning, can be picked up at the output of the second low-pass filter. The limit frequency in the first low-pass filter is lies at, for example, 100 kHz and in the second low-pass filter, for example, at 20 Hz. A capacitor belonging to the second low-pass filter 392 can also be capable of being externally connected to the integrated circuit.

In the case of stereo or twin-channel audio signals, for example, with the twin audio carrier technique, the filter 322, the limiter 391, the FM demodulator 33, the first low-pass filter 393 and the second low-pass filter 392 are all accordingly provided in duplicate.

We claim:

1. A method for an automatic balance of frequencies with which various operating modes can be switched on and with which at least one regulating variable is formed for the balance depending on a correspondingly accurate reference frequency, comprising the steps of:

a) an analog circuit, the frequency of which can be balanced, is fine tuned by means of this regulating variable;

b) the operating modes of a calibration mode, a measuring mode and a normal mode are provided;

c) in the calibration mode, one of the accurate reference frequency and a frequency derived from this reference frequency is used for balancing the analog circuit and at least one value influencing the regulating variable is stored;

d) after the balancing has been carried out in the calibration mode, a fine-tuning for a signal to be processed in the analog circuit is carried out in the measuring mode in response to the stored value which influences the regulating variable;

e) in the normal mode, the analog circuit is constantly fine-tuned by the regulating variable during the processing of the signal to be processed, thereby a target value of the regulating variable is derived from the corresponding value in the calibration mode.

2. The method according to claim 1 wherein the regulating variable is additionally influenced by a reference circuit section which represent a pattern for the balancing of the analog circuit which change due to manufacturing tolerances.

3. The method according to claim 1 wherein prior to an initial balancing in the normal mode or when selecting a different frequency for the signal to be processed in the analog circuit at least once, successively in the calibration mode, measuring mode and normal mode, are switched on.

4. The method according to claim 1 wherein the regulating variable is made up from a correcting regulating variable derived directly from the at least one of the values influencing the regulating variable and from an additional regulating variable which takes manufacturing tolerances into account, whereby these regulating variables are, in particular, control currents and the proportion of the additional regulating variable in a compound regulating variable can be matched to frequency used in the calibration and measuring modes.

5. The method according claim 1 wherein the value influencing one of the regulating variable and a correcting regulating variable respectively, is formed with the help of the difference between an output direct voltage component of the analog circuit and a respectively determined reference voltage.

6. The method according to claims 1 wherein the analog circuit, the frequency of which can be balanced, contains a reference circuit section and is an FM demodulator with one of an internal, current controlled oscillator and a current-controlled frequency generator.

7. Apparatus comprising:

an analog circuit, a frequency of which can be balanced with a regulating variable, a feeding point for a high-precision reference frequency, a first, second and third change-over switch, a first, second and third automatic gain control amplifier, a first and a second comparator, a summer, and with an internal capacitor, whereby an output voltage from the analog circuit is fed to a second inputs of the first and the second automatic gain control amplifiers and the first and second comparators;

a reference voltage is fed to a first input of the first automatic gain control amplifier in a normal mode;

a combined voltage, including the reference voltage and a compensation voltage, is fed to a first input of the second automatic gain control amplifier in a calibration mode;

a difference voltage, being the difference between the reference voltage and a threshold voltage is fed to a first input of the first comparator, and a summation voltage, being the sum of the reference voltage and the threshold voltage, is fed to a first input of the second comparator in a measuring mode;

an output signal from the first automatic gain control amplifier is fed to a first input of the third change-over switch in the normal mode;

an output signal from the second automatic gain control amplifier is fed to a third input of the third change-over switch in the calibration mode;

an output signal from the third change-over switch is fed to an input of the third automatic gain control amplifier;

an output signal from the third automatic gain control amplifier is fed to a first input of the summer;

a signal, derived from a size of the internal capacitor and modified by a factor (k), is fed to a second input of the summer;

an output signal from the summer is fed to a control input of the analog circuit;

a wanted signal which is to be processed in the analog circuit is fed to a first input of the first change-over switch in the normal mode;

a supplementary signal frequency is fed to a second input of the first change-over switch in the calibration and measuring modes;

one of the reference frequency and a frequency derived from it is fed to a first input of the second change-over switch in the calibration mode;

a signal frequency derived from an output signal of the first change-over switch is fed to a second input of the second change-over switch; and an output signal of the second change-over switch is fed to the analog circuit.

8. Apparatus according to claim 7, wherein the first, second and third automatic gain control amplifiers are transconductance amplifiers, and that the output signals from the transconductance amplifiers and the signals at the first and second input terminals of the summer and the output signal of the summer are currents.

9. Apparatus according to claim 7 wherein the combined voltage is a difference voltage.

10. Apparatus according to claim 7 wherein the signal modified by the factor (k) is a signal multiplied by the factor (k) in a multiplier.

* * * * *